United States Patent
Laifenfeld

(10) Patent No.: US 9,620,283 B2
(45) Date of Patent: Apr. 11, 2017

(54) LOW COST WIRELESS (RESISTIVE) SENSOR BASED ON IMPEDANCE COUPLING/MODULATION USING MRC

(71) Applicant: GM GLOBAL TECHNOLOGY OPERATIONS LLC, Detroit, MI (US)

(72) Inventor: Moshe Laifenfeld, Haifa (IL)

(73) Assignee: GM Global Technology Operations LLC, Detroit, MI (US)

( * ) Notice: Subject to any disclaimer, the term of this patent is extended or adjusted under 35 U.S.C. 154(b) by 138 days.

(21) Appl. No.: 14/631,113

(22) Filed: Feb. 25, 2015

(65) Prior Publication Data

US 2015/0243432 A1 Aug. 27, 2015

Related U.S. Application Data

(60) Provisional application No. 61/945,730, filed on Feb. 27, 2014.

(51) Int. Cl.
*G01R 35/00* (2006.01)
*H01F 38/14* (2006.01)
(Continued)

(52) U.S. Cl.
CPC ............ *H01F 38/14* (2013.01); *B60L 11/005* (2013.01); *B60L 11/182* (2013.01); *B60L 11/1824* (2013.01); *G01R 27/02* (2013.01); *G01R 35/005* (2013.01); *B60L 2210/30* (2013.01); *B60L 2210/40* (2013.01); *B60L 2240/527* (2013.01); *B60L 2240/545* (2013.01); *B60L 2240/547* (2013.01); *B60L 2270/147* (2013.01);
(Continued)

(58) Field of Classification Search
CPC .... H01F 38/14; B60L 11/1824; B60L 11/005; B60L 11/182; B60L 2240/527; B60L 2210/40; B60L 2240/547; B60L 2240/545; B60L 2210/30; B60L 2270/147; G01R 35/005; G01R 27/02; Y02T 10/7241; Y02T 10/7022; Y02T 90/14; Y02T 90/127; Y02T 90/122; Y02T 90/12; Y02T 90/121; Y02T 10/7072; Y02T 10/7005
USPC ....................................................... 324/601
See application file for complete search history.

(56) References Cited

U.S. PATENT DOCUMENTS

| | | | |
|---|---|---|---|
| 4,953,393 | A | 9/1990 | Galasko et al. |
| 6,906,624 | B2 | 6/2005 | McClelland et al. |

(Continued)

*Primary Examiner* — Billy Lactaoen
(74) *Attorney, Agent, or Firm* — John A. Miller; Miller IP Group, PLC

(57) ABSTRACT

A system for transmitting data signals from a sensor on a vehicle through magnetic resonance coupling (MRC). The system includes a control circuit having a base coil, a variable current source, a variable capacitor and a control load, where the variable current source and the capacitor are tuned to provide a predetermined AC current to the base coil so as to generate an oscillating magnetic field at a predetermined frequency. The system also includes a receiver circuit associated with the sensor, where the receiver circuit includes a receiver coil, a tuning capacitor and a variable resistive load. The receiver coil is tuned and magnetically coupled to the base coil at the predetermined frequency. A change in the variable resistive load in the receiver circuit in response to a sensor measurement causes a change in the voltage across the control load that gives an indication of the sensor measurement.

20 Claims, 2 Drawing Sheets

(51) Int. Cl.
  *B60L 11/18* (2006.01)
  *G01R 27/02* (2006.01)
  *B60L 11/00* (2006.01)

(52) U.S. Cl.
  CPC ........ *Y02T 10/7005* (2013.01); *Y02T 10/7022* (2013.01); *Y02T 10/7072* (2013.01); *Y02T 10/7241* (2013.01); *Y02T 90/12* (2013.01); *Y02T 90/121* (2013.01); *Y02T 90/122* (2013.01); *Y02T 90/127* (2013.01); *Y02T 90/14* (2013.01)

(56) References Cited

U.S. PATENT DOCUMENTS

| | | |
|---|---|---|
| 2004/0267501 A1 | 12/2004 | Freed et al. |
| 2011/0029282 A1 | 2/2011 | Berkcan et al. |
| 2012/0098348 A1* | 4/2012 | Inoue .............. B60L 11/123 307/104 |
| 2012/0169137 A1* | 7/2012 | Lisi .............. H02J 5/005 307/104 |
| 2013/0136152 A1 | 5/2013 | Draeger et al. |
| 2013/0312533 A1 | 11/2013 | Berkcan et al. |
| 2014/0246901 A1* | 9/2014 | Ichikawa .............. H02J 5/005 307/9.1 |
| 2014/0354223 A1* | 12/2014 | Lee .............. H02J 5/005 320/108 |
| 2015/0123679 A1 | 5/2015 | Kuyvenhoven et al. |
| 2015/0328997 A1* | 11/2015 | Hashizume .............. H02J 5/005 307/104 |

\* cited by examiner

LOW COST WIRELESS (RESISTIVE) SENSOR BASED ON IMPEDANCE COUPLING/MODULATION USING MRC

CROSS-REFERENCE TO RELATED APPLICATIONS

This application claims the benefit of the priority date of U.S. Provisional Patent Application Ser. No. 61/945,730, titled, Low Cost Wireless (Resistive) Sensor Based on Impedance Coupling/Modulation Using MRC, filed Feb. 27, 2014.

BACKGROUND OF THE INVENTION

Field of the Invention

This invention relates generally to a system and method for transmitting data signals from a sensor through magnetic resonance coupling (MRC) and, more particularly, to a system and method for transmitting data signals from a sensor on a vehicle through MRC, where a change in a variable complex impedance load in a receiver circuit associated with the sensor causes a change in the magnetic coupling between a receiver coil in the receiver circuit and a base coil in a control circuit that changes a control load in the control circuit.

Discussion of the Related Art

Modern vehicles employ many sensors, actuators, controllers, sub-systems, buses, etc. that require electrical wiring to operate the devices. As the number of vehicle systems increases, so does the wiring necessary to support those systems. However, there are a number of disadvantages with providing wires in a vehicle, especially many wires. For example, the electrical conductor of the wires, such as copper, has significant weight. As the weight of a vehicle increases, fuel efficiency decreases. Further, wiring in a vehicle is susceptible to damage, which increases the warranty cost of the vehicle. Also, requiring wiring throughout the vehicle reduces the flexibility in design and manufacturing of the vehicle. Further, at least some of the wiring in a vehicle often requires periodic maintenance. Also, wiring adds significant expense and cost. Further, during manufacture of the vehicle, assembly of cable harnesses often causes problems as a result of breaking or bending of connector pins. Therefore, it would be desirable to eliminate or reduce the wiring in a vehicle.

It is known in the art to employ wireless technology in a vehicle for communications purposes at least in limited circumstances. However, the transmission of wireless signals also suffers from a number of disadvantages including interference with signals from other vehicles, potential interference with signals from consumer devices brought into the vehicle, unnecessary radiation inside the passenger compartment of the vehicle, and fading issues, which result in loss of signal, requiring larger transmitted power and large power consumption.

SUMMARY OF THE INVENTION

The following disclosure describes a system and method for transmitting data signals from a sensor through magnetic resonance coupling (MRC). In one embodiment, the system is on a vehicle. The system includes a control circuit having a base coil, a variable current source, a variable capacitor and a control load, where the variable current source and the capacitor are tuned to provide a predetermined AC current to the base coil so as to generate an oscillating magnetic field at a predetermined frequency. The system also includes a receiver circuit associated with the sensor, where the receiver circuit includes a receiver coil, a tuning capacitor and a variable resistive load. The receiver coil is tuned and magnetically coupled to the base coil at the predetermined frequency. A change in the variable complex load in the receiver circuit in response to a sensor measurement causes a change in the voltage across the control load that gives an indication of the sensor measurement.

Additional features of the present invention will become apparent from the following description and appended claims, taken in conjunction with the accompanying drawings.

DETAILED DESCRIPTION OF THE EMBODIMENTS

The following discussion of the embodiments of the invention directed to a magnetic resonance coupling system for transmitting data signals from a sensor on a vehicle through magnetic resonance coupling (MRC) is merely exemplary in nature, and is in no way intended to limit the invention or its applications or uses. For example, as discussed, the magnetic resonance coupling system has particular application for transmitting data signals from a sensor on a vehicle. However, as will be appreciated by those skilled in the art, the magnetic resonance coupling system may have other applications on other mobile platforms, such as on trains, machines, tractors, boats, recreation vehicles, etc.

The present invention proposes a system and method for providing wireless power and data communications through magnetic resonance coupling (MRC) for various peripheral devices, such as switches, actuators, sensors, etc., on a vehicle. As is well understood by those skilled in the art, MRC employs a quasi-static magnetic field between two or more coils, where the coils are tuned to resonate at the same frequency. An alternating current is provided on one of the coils, which generates an oscillating magnetic field. The oscillating magnetic field is received by the other coil that induces an oscillating current in that coil, which can be used to charge a power source, such as a capacitor or a rechargeable battery, and can be used to provide high rate data transfer, as will be discussed in detail below.

Figure 1:
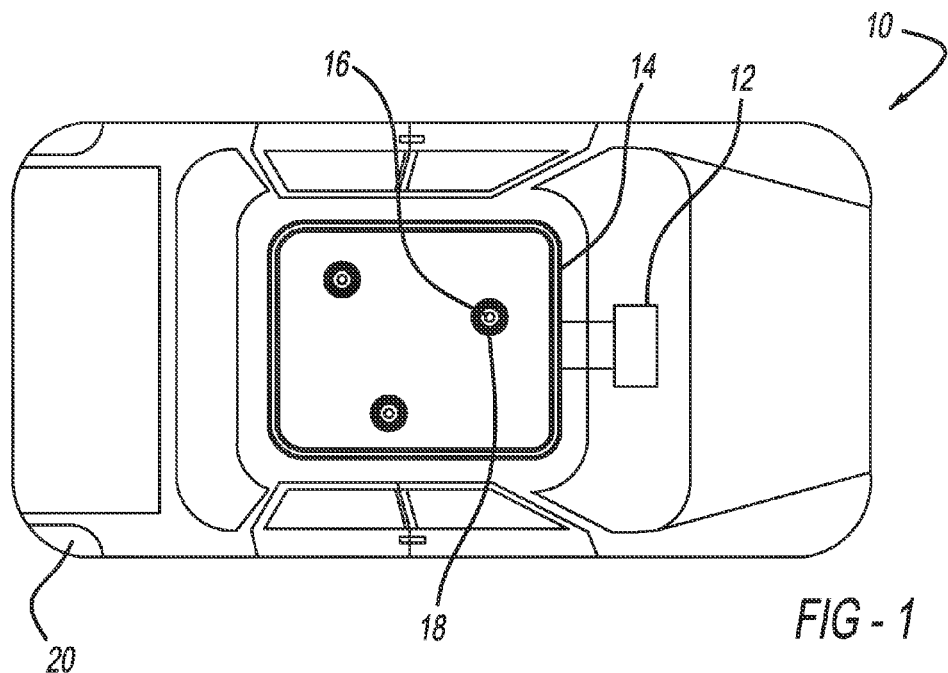
FIG. 1 is a top view of a vehicle including a transmitter coil encircling a plurality of peripheral devices each including secondary coils.

In one embodiment, the MRC system includes a relatively large base coil, sometimes referred to herein as a transmitter coil, and several smaller secondary or receiver coils each provided as part of a peripheral device. FIG. 1 is a top view of a vehicle 10 including an electronic control unit (ECU) 12 for a particular sub-system of the vehicle 10, such as an engine controller. A large base coil 14 is embedded in the vehicle 10 at the particular location of the sub-system, where the coil 14 encloses all of the peripheral devices that are part of that sub-system. Particularly, a number of peripheral devices 16, such as switches, actuators, sensors, etc., are provided within the base coil 14 and each includes its own secondary coil 18. As will be discussed, the base coil 14 is controlled to resonate at a particular frequency and produce an oscillating magnetic field that is received by the coils 18 that can then be used to charge a power source in the device 16 through magnetic resonance coupling. Also, the magnetic resonance coupling can be using for data transfer between the ECU 12 and the devices 16. In order to provide the most efficient transfer of energy from the base coil 14 to the secondary coils 18, it is desirable, but not necessary, that all of the devices 16 be positioned within the coil 14, and preferably on the same plane as the coil 14. In one embodiment, the peripheral device is an LED tail light 20 on the vehicle 10 that is powered by the base coil 14 and/or receives communications signals from the base coil 14, for example, to turn on the light 20, consistent with the discussion herein.

Figure 2:
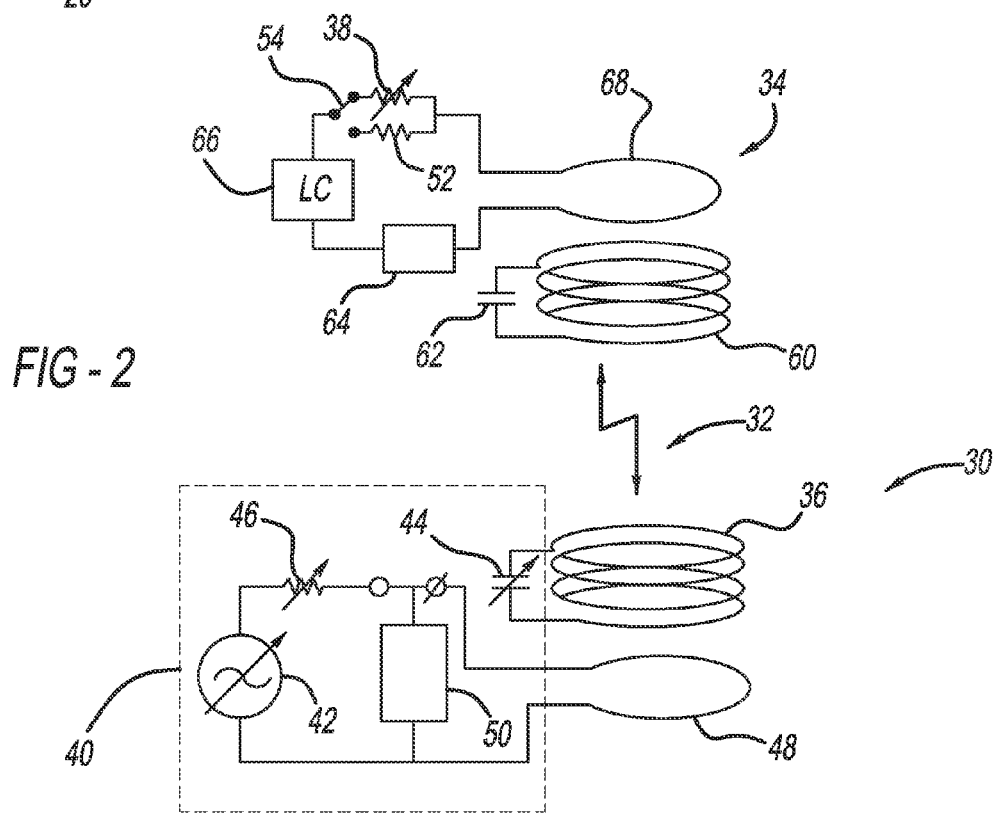
FIG. 2 is a schematic diagram of a magnetic resonance coupling circuit including a transmitter side and a receiver side.

FIG. 2 is a schematic diagram of an MRC circuit 30 separated from the vehicle 10. The circuit 30 includes a transmitter side 32 and a sensor or receiver side 34, where the receiver side 34 includes one of the peripheral devices that may receive power signals from the transmitter side 32. In this non-limiting embodiment, the receiver side 34 includes a sensor 38. The transmitter side 32 includes a base coil 36, representing the base coil 14, and a controller or ECU 40, representing the ECU 12. The ECU 40 includes a variable current source 42 that provides an alternating current that is tuned by a variable tuning capacitor 44 in conjunction with a variable load 46, which causes the coil 36 to generate an oscillating magnetic field at a particular frequency. The source 42 and the variable capacitor 44 can be selectively controlled by the ECU 40 to provide different frequencies so that the base coil 36 can be tuned to multiple resonant frequencies if desired. In one non-limiting embodiment, the ECU 40 can employ pulse width modulation (PWM) to vary the frequency of the current provided by the source 42, which changes the resonate frequency of the coil 36. The transmitter side 32 also includes a mini-loop 48 that provides impedance matching between the load 46 and the source 42. It is noted that the mini-loop 48 is not required for some embodiments. An impedance meter 50 allows the ECU 40 to estimate measurement signals from an analog sensor circuit or decode digital signals from a digital sensor circuit, as will be discussed in more detail below.

The receiver side 34 includes a receiver coil 60 that generates a current in response to the oscillating magnetic field received from the base coil 36. The receiver side 34 also includes a mini-loop 68 providing impedance matching to the coil 60. It is noted that the mini-loop 68 is not required for some embodiments. An optional fixed LC network 66 can be provided in the circuit to help provide impedance matching between the mini-loop 68 and the receiver coil 60. As the magnetic field oscillates, the receiver coil 60 generates an AC signal, which is tuned to a particular resonant frequency by a tuning capacitor 62, so that the resonant frequency of the coil 60 provides strong magnetic coupling with the base coil 36 when the oscillating magnetic field is at the tuned frequency of the coil 60. When the oscillating magnetic field is tuned to one or more of the receiver coils 60 so that an alternating current signal is generated therein, that current can be used to charge a rechargeable power source 64, such as a rechargeable battery or super-capacitor, in the receiver side 34, which includes a rectifier to convert the AC signal to a DC signal. The power stored in the power source 64 can then be used to provide power for the sensor 38. Each of the peripheral devices associated with a particular transmitter circuit can be tuned to the same frequency and receive power signals at the same time. Alternately, such as for data transfer applications, one or more of the receiver coils 60 in the peripheral devices 16 can be tuned to a different frequency, and each of those frequencies can be provided by the transmitter circuit 32 by controlling the current source 42 and the capacitor 44. It is further noted that multiple base coils can be associated with a single controller to allow for communications with several peripherals in parallel.

Because of the size, weight and other requirements of the base coil 36, it may be desirable to remove the base coil 36 from the vehicle 10, if possible. In an alternate embodiment, the base coil or coils for the various vehicle sub-systems is removed from the vehicle 10 and a single coil is employed in a charging station to charge all of the peripheral devices 16 on the vehicle 10, and possibly a vehicle battery. It is known in the art to provide a charging station for an electric vehicle, where the charging station includes a charging pad having a coil that charges the vehicle battery through magnetic resonance coupling. The present invention proposes using the same charging pad for charging the vehicle battery to also charge the various peripheral devices 16 on the vehicle 10.

Figure 3:
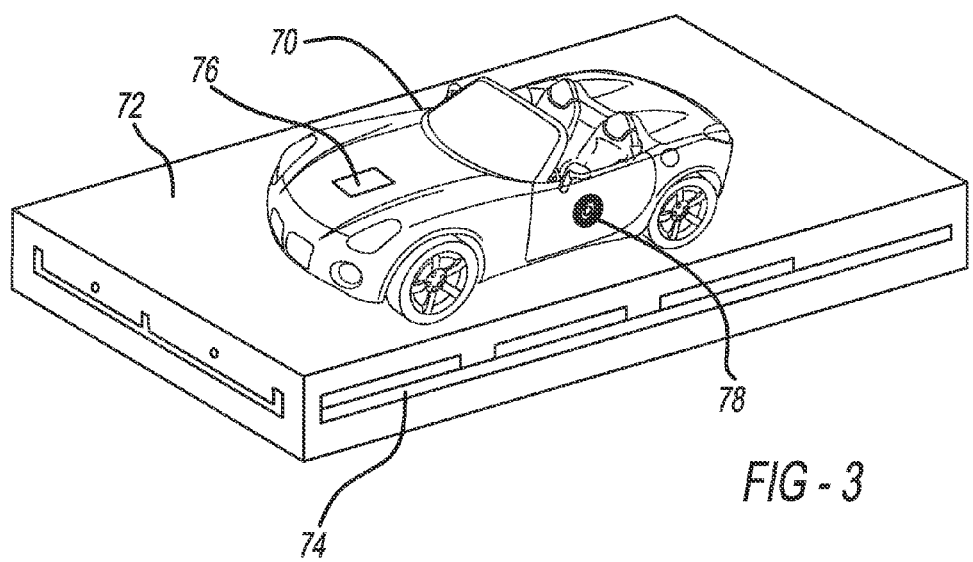
FIG. 3 is an isometric view of a vehicle parked on a charging pad.

This embodiment is illustrated in FIG. 3 showing a vehicle 70 parked on a charging pad 72, such as may be mounted in the floor of a garage. The charging pad 72 includes a coil or power track 74 that is coupled to an AC power source (not shown), such as an electrical outlet in the garage. The power track 74 generates an oscillating magnetic field that charges a vehicle battery 76 on the vehicle 70 in the known manner. That same oscillating magnetic field can be used to provide power to one or more peripheral devices 78 on the vehicle 70. In this way, the large base coil is not required to be on the vehicle 70.

The discussion above talks about using magnetic resonance coupling to wirelessly provide power for peripheral devices on a vehicle. If the transmitter side 32 is only providing power signals to a plurality of peripheral devices each including a separate receiver coil, then each of the receiver coils can be tuned to a single frequency and all be powered simultaneously when the transmitter side 32 is providing the oscillating magnetic field. The present invention also proposes using the same magnetic resonance coupling, such as between the base coil 36 and the receiver coil 60, to provide a transfer of data from the peripheral device if the device is a sensor, such as a temperature sensor, pressure sensor, stress sensor, force sensor, etc., to the ECU 40. This embodiment assumes that the base coil 36 is on the vehicle 10, and is not part of the charging pad 72. If the magnetic resonance coupling is being used for data transfer, then the receiver circuits for the several sensors can be tuned to different frequencies so as to prevent interference between the data signals being sent. Tuning of the base coil 36 for the several resonant frequencies can be provided by scanning through the frequencies, for example, using time division multiplexing, by selectively controlling the tuning provided by the capacitor 44 and the power source 42. Circuitry can also be provided that allows the transmitter side 32 to send control signals to the receiver side 34 also through magnetic resonance coupling.

As will be discussed in detail below, the present invention proposes two techniques for obtaining sensor data from the sensor at the ECU 40 through magnetic resonance coupling. For the first technique, discussed with reference to FIG. 2, where the receiver side 34 is an analog sensor circuit, the sensor 38 itself is a resistive device whose complex impedance changes in response to the environmental condition being sensed, and that impedance is read directly into the secondary coil circuitry. The sensor 38 provides a certain resistance depending on the condition that is being sensed, such as pressure, temperature, strain, etc. The sensor 38 is electrically coupled to the mini-loop 68 that provides impedance matching between the sensor 38 and the receiver coil 60. When the resistance of the sensor 38 changes a variation occurs in the magnetic coupling between the coils 38 and 60, which causes a change in the current flow through the coil 36, which in turn changes the voltage across the load 46 that is detected by the ECU 40 to provide an indication of the sensor measurement.

A calibration resistor 52 can also be provided as part of the sensor 38 in an optional embodiment that can be switched into the receiver circuit by a switch 54 to provide a fixed impedance for calibration purposes. Particularly, since the change in resistance of the sensor 38 in response to the measured environmental condition may drift over time, it may be desirable to provide a known impedance into the coil circuit on the receiver side 34 that can be detected by the ECU 40 for dynamic calibration purposes.

Figure 4:
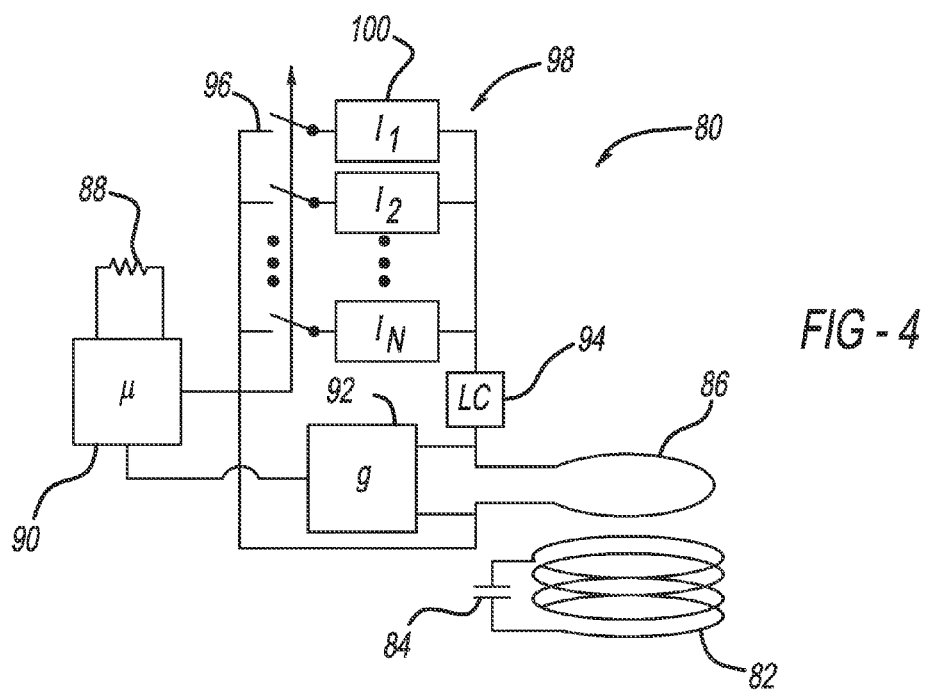
FIG. 4 is a schematic diagram of an analog sensor circuit.

The second data transfer technique translates the sensor reading or measurement to a digital value that is encoded or translated into a sequence of complex loads that are switched into the receiver coil. FIG. 4 is a schematic diagram of a digital sensor circuit 80 similar to the receiver side 34 of the circuit 30 to illustrate this embodiment. The circuit 80 includes a sensor coil 82 having a variable tuning capacitor 84. The circuit 80 also includes a mini-loop 86 that provides impedance matching, as discussed above. It is noted that the mini-loop 86 is not required for some embodiments. The digital sensor circuit 80 further includes a sensor 88 that provides an analog signal that is then converted to a digital signal in a microcontroller 90. The circuit 80 also includes a rectifier and energy storage device 92 that is charged to provide power for the circuit 80. As above, an optional fixed LC network 94 can be provided for impedance matching purposes.

The microcontroller 90 includes, for example, a table that stores a matrix of complex loads, where each load identifies a particular measurement of the sensor 88. Depending on the value of the digital signal received by the microcontroller 90, the microcontroller 90 selects the sequence of appropriate complex loads from the table and encodes it as a sequence of digital bits that control switches in the circuitry of the coil 82 through a variable complex impedance load, which provides a digital QAM type of modulation of the current flow within the coil 82. This modulated impedance load affects the strong magnetic resonance coupling between the coils 36 and 82 that alters the current flow through the coil 36, which changes the voltage across the resistive load 46 in the base coil circuit, where that voltage change across the resistive load 46 can be detected by the ECU 40, thus providing an indication of the sensor measurement to the ECU 40. By selectively tuning the base coil 36 to the resonant frequency of a particular receiver coil, data from the sensor associated with that coil can be obtained.

Depending on the value of the sensor signal received and digitally converted by the microcontroller 90, the microcontroller 90 controls one or more switches 96 in a fixed complex load ladder 98 to selectively switch loads 100 into the circuit 80. As discussed above, based on the measured sensor value, the microcontroller 90 chooses a load 100, or a combination of the loads 100, as the complex load to be coupled to the transmitter circuit. If the complex load is represented by a one byte value, at most 256 different complex load bits are needed. Fewer loads can be employed by using a combination of switches or sequentially encoding fewer bits, for example, two bits at a time, requiring only four different complex loads, and four time slots to complete the transmission. The complex loads 100 are chosen so that the minimum distance between the constellation points in the digital signal is maximized to increase the signal-to-noise ratio performance. Also, as above with the analog sensor, a known sequence of the loads 100 can be switched into the circuit as a reference to compensate for variations, drift, etc., in the magnetic field coupling for dynamic calibration purposes.

As discussed above, the same magnetic resonance coupling between transmitter circuit and receiver circuit can be used to provide both power for the receiver circuit and data transfer from the receiver to the transmitter circuit. The transmitter circuit switches to a resonant frequency that matches a particular sensor circuit to provide power for the sensor circuit and then reads its measurement signal. The transmitter circuit then switches its resonant frequency to the next sensor and so on. The time that the transmitter circuit dwells on a particular sensor circuit is the time required to power the sensor, make the sensor reading and allow for it to communicate back to the transmitter circuit. For the analog sensor circuit this time frame is almost instantaneous, where some time is needed to allow for the frequency to stabilize. For the digital sensor circuit, the time should be such that enough energy is accumulated in the rectifier and energy storage device to allow for the microcontroller to wake up and perform the measurement and transmit the information back to the transmitter circuit. This time may take several milliseconds depending on the distance, sensor requirements, etc.

As discussed above, both the analog sensor embodiment and the digital sensor embodiment provides sensor signals through magnetic resonance coupling that are received by the transmitter circuit. In an alternate embodiment, both the analog sensor circuit and the digital sensor circuit can include a controller and impedance meter so as to allow the transmitter circuit to send signals, such as commands, to the sensor circuit.

The foregoing discussion discloses and describes merely exemplary embodiments of the present invention. One skilled in the art will readily recognize from such discussion and from the accompanying drawings and claims that various changes, modifications and variations can be made therein without departing from the spirit and scope of the invention as defined in the following claims.

What is claimed is:

1. A magnetic resonance coupling (MRC) circuit comprising:
   a control circuit including a base coil, a variable current source, a variable tuning capacitor and a control load, said variable current source selectively providing a predetermined current to the base coil so as to generate an oscillating magnetic field at a predetermined frequency; and
   at least one receiver circuit including a receiver coil, a tuning capacitor and a sensor that measures an environmental condition, said receiver coil being tuned to a resonant frequency that causes it to be magnetically coupled to the base coil at the predetermined frequency, wherein sensor measurements provided by the sensor in the at least one receiver circuit cause a change in the magnetic coupling between the base coil and the receiver coil that causes a change in the voltage across the control load.

2. The MRC circuit according to claim 1 wherein the at least one receiver circuit is a plurality of receiver circuits each being tuned to a separate resonant frequency, said control circuit changing the predetermined frequency to be tuned to a particular receiver coil to communicate with that receiver circuit.

3. The MRC circuit according to claim 1 wherein the at least one receiver circuit includes a microcontroller and a complex load ladder including a plurality of complex loads, said sensor providing a measurement signal to the microcontroller and said microcontroller selectively switching in one or more of the complex loads into the receiver circuit as determined by the measurement signal.

4. The MRC circuit according to claim 3 wherein the microcontroller includes a table that stores complex load values for different measurement signals.

5. The MRC circuit according to claim 3 wherein the microcontroller selectively switches a predetermined sequence of the complex loads as a reference load.

6. The MRC circuit according to claim 1 wherein the sensor is a variable resistive load, and wherein the measurement of the environmental condition directly causes a change in the magnetic coupling.

7. The MRC circuit according to claim 6 wherein the sensor includes a calibration resistor having a known resistance provided for calibration purposes, said calibration resistor being selectively switched into the receiver circuit.

8. The MRC circuit according to claim 1 wherein the control circuit and the receiver circuit are on a vehicle.

9. The MRC circuit according to claim 1 wherein the sensor is a pressure, temperature or strain sensor.

10. A magnetic resonance coupling (MRC) circuit for providing data transfer from a sensor on a vehicle to a controller, said MRC circuit comprising:
   a control circuit on the vehicle including the controller, a base coil, a variable current source, a tuning capacitor and a control load, said variable current source providing a predetermined current to the base coil so as to generate an oscillating magnetic field at a predetermined frequency; and
   at least one receiver circuit on the vehicle including the sensor, a receiver coil, a tuning capacitor, a complex load ladder including a plurality of complex loads and a microcontroller, said receiver coil being tuned to a resonant frequency, said receiver coil being magnetically coupled to the base coil at the predetermined frequency, said sensor providing a measurement signal to the microcontroller and said microcontroller selectively switching in one or more of the complex loads into the receiver circuit as determined by the measurement signal, wherein a change in the complex load in the receiver circuit causes a change in the magnetic coupling between the base coil and the receiver coil that causes a change in the voltage across the control load.

11. The MRC circuit according to claim 10 wherein the at least one receiver circuit is a plurality of receiver circuits each being tuned to a separate resonant frequency, said control circuit changing the predetermined frequency to be tuned to a particular receiver coil to communicate with that receiver circuit.

12. The MRC circuit according to claim 10 wherein the microcontroller includes a table that stores complex load values for different measurement signals.

13. The MRC circuit according to claim 10 wherein the microcontroller selectively switches a predetermined sequence of the complex loads as a reference load.

14. The MRC circuit according to claim 10 wherein the sensor is a resistive sensor, said sensor including a calibration resistor having a known resistance provided for calibration purposes, said calibration resistor being selectively switched into the receiver circuit.

15. The MRC circuit according to claim 10 wherein the sensor is a pressure, temperature or strain sensor.

16. A magnetic resonance coupling (MRC) circuit for providing data transfer from a resistive sensor on a vehicle measuring an environmental condition to a controller, said MRC circuit comprising:
   a control circuit on the vehicle including the controller, a base coil, a variable current source, a tuning capacitor and a control load, said variable current source providing a predetermined current to the base coil so as to generate an oscillating magnetic field at a predetermined frequency; and
   at least one receiver circuit on the vehicle including the sensor, a receiver coil and a tuning capacitor, said receiver coil being magnetically coupled to the base coil at the predetermined frequency, said sensor including the variable resistive load, where the measurement of the environmental condition directly causes a change in the magnetic coupling between the base coil and the receiver coil that causes a change in voltage across the control load that is read by the controller.

17. The MRC circuit according to claim 16 wherein the at least one receiver circuit is a plurality of receiver circuits each being tuned to a separate resonant frequency, said control circuit changing the predetermined frequency to be tuned to a particular receiver coil to communicate with that receiver circuit.

18. The MRC circuit according to claim 16 wherein the at least one receiver circuit includes a microcontroller and a complex load ladder including a plurality of complex loads, said sensor providing a measurement signal to the microcontroller and said microcontroller selectively switching in one or more of the complex loads into the receiver circuit as determined by the measurement signal.

19. The MRC circuit according to claim 16 wherein the sensor includes a calibration resistor having a known resistance provided for calibration purposes, said calibration resistor being selectively switched into the receiver coil.

20. The MRC circuit according to claim 16 wherein the sensor is a pressure, temperature or strain sensor.

* * * * *